US012635096B2

(12) United States Patent
    Homuth

(10) Patent No.: US 12,635,096 B2
(45) Date of Patent: May 19, 2026

(54) ELECTRIC COMPRESSOR WITH A HERMETIC TERMINAL AND A CONNECTOR, A CONNECTOR FOR THE COMPRESSOR, A METHOD OF SEALING A SOCKET, AND A METHOD OF ASSEMBLING A COMPRESSOR

(71) Applicant: MOTOR COMPETENCE CENTER HOLDING FLENSBURG GMBH, Flensburg (DE)

(72) Inventor: Dirk Homuth, Plon (DE)

(73) Assignee: MOTOR COMPETENCE CENTER HOLDING FLENSBURG GMBH, Flensburg (DE)

( * ) Notice: Subject to any disclaimer, the term of this patent is extended or adjusted under 35 U.S.C. 154(b) by 177 days.

(21) Appl. No.: 18/718,955

(22) PCT Filed: Dec. 15, 2022

(86) PCT No.: PCT/EP2022/086099
    § 371 (c)(1),
    (2) Date: Jun. 12, 2024

(87) PCT Pub. No.: WO2023/111159
    PCT Pub. Date: Jun. 22, 2023

(65) Prior Publication Data
    US 2025/0040073 A1      Jan. 30, 2025

(30) Foreign Application Priority Data
    Dec. 15, 2021    (EP) .................................... 21214715

(51) Int. Cl.
    *H05K 5/06*          (2006.01)
    *H05K 5/02*          (2006.01)

(52) U.S. Cl.
    CPC ............. *H05K 5/06* (2013.01); *H05K 5/0247* (2013.01)

(58) Field of Classification Search
    None
    See application file for complete search history.

(56)                References Cited

U.S. PATENT DOCUMENTS 4,748,531  A      5/1988  Ortiz
    4,840,547  A      6/1989  Fry
                    (Continued)

FOREIGN PATENT DOCUMENTS

CN        101324236  A     12/2008
    CN        204441544  U      7/2015
                    (Continued)

OTHER PUBLICATIONS

Chinese Search Report from Corresponding Chinese Patent Application No. CN202180041146.9, Jun. 29, 2025.
                    (Continued)

*Primary Examiner* — Xanthia C Relford
(74) *Attorney, Agent, or Firm* — Workman Nydegger

(57)                ABSTRACT

An electric hermetic compressor includes a hermetic terminal with terminal pins for electrical connection of a motor inside a hermetic housing. The hermetic terminal forms a cavity, and the compressor further has a non-conductive sealing element which defines an enclosed space in the cavity. The sealing element forms part of a connector which defines a separate cable space isolated from the electric compression assembly in the hermetic accommodation.

17 Claims, 6 Drawing Sheets

(56) References Cited

U.S. PATENT DOCUMENTS

| | | | |
|---|---|---|---|
| 4,966,559 A | 10/1990 | Wisner | |
| 5,580,282 A | 12/1996 | Paterek | |
| 6,375,497 B1 | 4/2002 | Diflora | |
| 6,910,904 B2 * | 6/2005 | Herrick | F04C 23/008 439/942 |
| 7,255,585 B2 * | 8/2007 | Kameyama | H02G 3/088 439/271 |
| 8,210,835 B2 | 7/2012 | Asaka | |
| 8,840,381 B2 * | 9/2014 | Fukasaku | F04B 35/04 310/71 |
| 10,033,127 B2 * | 7/2018 | Bellet | H01R 13/424 |
| 2003/0119373 A1 | 6/2003 | Quadir | |
| 2004/0253124 A1 | 12/2004 | Ioi et al. | |
| 2009/0060749 A1 | 3/2009 | Hoying et al. | |
| 2011/0076162 A1 * | 3/2011 | Heidecker | H01R 13/5219 417/313 |
| 2011/0158833 A1 | 6/2011 | Murakami et al. | |
| 2012/0302100 A1 | 11/2012 | Picker et al. | |

FOREIGN PATENT DOCUMENTS

| | | |
|---|---|---|
| CN | 110663140 A | 1/2020 |
| EP | 3430262 A1 | 1/2019 |

OTHER PUBLICATIONS

International Search Report from PCT Application No. PCT/EP2021/066671, Oct. 8, 2021.

International Preliminary Report on Patentability from PCT Application No. PCT/EP2021/066671, Jul. 13, 2022.

European Search Report from corresponding European Patent Application No. 21214715, filed Mar. 11, 2022.

International Search Report from corresponding PCT Application No. PCT/EP2022/086099, Mar. 14, 2023.

International Preliminary Report on Patentability from corresponding PCT Application No. PCT/EP2022/086099, Feb. 2, 2024.

* cited by examiner

ELECTRIC COMPRESSOR WITH A HERMETIC TERMINAL AND A CONNECTOR, A CONNECTOR FOR THE COMPRESSOR, A METHOD OF SEALING A SOCKET, AND A METHOD OF ASSEMBLING A COMPRESSOR

INTRODUCTION

The present invention relates to a hermetic electric compressor with an electric motor. The compressor comprises a hermetic terminal forming part of the housing and comprising at least two terminal pins and a connector engaging the terminal pins inside the hermetic accommodation to electrically connect at least one winding of the electric motor to an external power source via the pins.

The power source is typically a grid connection but could also be a battery connection or a connection to other sources of energy.

The hermetic terminal of such compressors typically comprises a terminal holder forming part of the housing, typically welded into the wall of the housing. The hermetic terminal may comprise at least two terminal pins made of an electrically conductive material. These terminal pins extend through the terminal holder. An insulative element is arranged to insulate each terminal pin from the terminal holder. The insulative element is sometimes referred to as a glass frit.

BACKGROUND

Hermetic electric compressors comprise an electric motor accommodated in a hermetically sealed housing. Such compressors are used e.g., for household refrigeration, light commercial refrigeration, and heating purpose. The sealed housing contains a refrigerant which is circulated between a condenser and an evaporator. By phase shifts between liquid and vapour phases, thermal exchange can provide efficient heating and cooling. Examples of refrigerants include R134a, R407C, R744 ($CO_2$), and R290.

The hermetic terminal includes terminal pins, which are formed from a conductive material, e.g., different kinds of alloys such as steel. The hermetic terminal further includes a terminal holder which holds the terminal pins. The terminal holder is typically made of alloys such as steel. An insulative element, i.e., a material, such as a ceramic, glass, or epoxy is arranged between the terminal pins and the terminal holder, and the terminal holder is typically welded into an opening in the sealed housing of the compressor and thereby preserves the sealed structure of the compressor.

US2004/253124 discloses an encapsulated electrically driven compressor for a motor vehicle. The compressor includes a sealed housing, a compressor device, and a terminal connecting device for electrically connecting the electric motor to an inverter device which is arranged at an outer side of the hermetically sealed housing. US2009/0060749 discloses a plug assembly for a compressor. The plug assembly comprises a cavity or connector body with a sealing member 86. The plug is outside the hermetic accommodation.

Often, the electric motor comprises a main winding and an auxiliary winding, and to power the windings, the hermetic terminal comprises three terminal pins, one for connecting a common potential, i.e., the zero or phase, and the two other terminal pins for connecting to each of the main winding and auxiliary winding. The electric motor could also be a DC motor, or a permanent magnet AC or DC motor etc.

During operation, liquids constituted by lubricant and refrigerant in the housing, contaminates the interior of the hermetic accommodation. The liquids typically contain metallic particles arising from wear of moving metal parts in the compression assembly, inter alia from the electric motor. Soiling of electrical connections may impair correct functioning of the compressor.

SUMMARY OF THE INVENTION

It is an object of the disclosure to improve the hermetic electric compressors, particularly for use in heat pumps, refrigerators, freezers, air condition systems, and in any similar application. It is a further object to improve the assembly procedure in compressor manufacturing.

For these and other objects, the disclosure provides an electric compressor comprising:

a compressor housing with a wall forming a hermetic accommodation, an electrically driven compression assembly arranged in the hermetic accommodation, a terminal holder forming part of the wall and defining a cavity in the hermetic accommodation, conductive terminal pins extending through the terminal holder and terminating in the hermetic accommodation, the terminal pins being electrically insulated from the terminal holder, and a connector.

The connector is arranged inside the hermetic accommodation and comprises:

a socket for each terminal pin, each socket receiving a corresponding one of the terminal pins, a cable housing accommodating each socket in a cable space outside the cavity, a sealing element with an outer surface facing the cavity and an opposite inner surface, e.g., facing the cable space, the sealing element defining a closure for the cavity and thereby separating the cavity from the compression assembly in the hermetic accommodation, and for each socket, a cable extending from a corresponding one of the sockets out of the cable space and connecting one of the terminal pins electrically to the compression assembly.

The cable housing forms a sealed accommodation of the sockets separated from the compression assembly in the hermetic accommodation.

Due to the cable housing which forms a sealed accommodation of the sockets separated from the compression assembly, the risk of contamination of the connection between the terminal pins and the sockets is reduced, and the risk of leakage current across the insulative elements surrounding the terminal pins is reduced.

The cable housing may particularly be directly against the sealing element, and the sealing element and cable housing may be non-releasably joined or formed in one part, e.g. by adhesively gluing them together, or by making them in one part in an injection moulding process. Herein, this one component is hereinafter referred to as a connector body.

The connector may comprise a cable seal forming part of or being attached to the cable housing and defining an exit for the cables out of the cable space. The cable seal fits tightly between the cable and the cable housing and thereby prevents oil and similar contaminants from entering the cable space. The cable seal may be more elastically deformable than the cable housing. It could e.g., be made as a soft rubber component on a hard plastic component.

The outer surface of the sealing element comprises an opening for each terminal pin such that the terminal pins may enter the cable housing via the openings.

The openings may fit tightly about the corresponding terminal pin and the sealing element thereby seals the cable space from the cavity. If contaminants, despite the sealed accommodation offered by the cable housing, should enter the cable housing, the tight fitting of the openings around the terminal pins reduces further the risk of contaminants reaching the insulative sealing elements where the terminal pins enter through the terminal holder.

Each socket may comprise an elastically deformable metal member arranged directly adjacent the inner surface of the sealing element. The deformable metal member is configured to receive one of the terminal pins extending through one of the openings in the sealing element to thereby fixate the terminal pin to the socket structure by friction.

The elastically deformable metal member may be fixed to the sealing element such that it cannot move relative to the sealing member. This allows the socket to function as a holder which maintains the sealing element in a releasably attached position where it defines a closure for the cavity.

The terminal holder may define an edge extending about the cavity inside the hermetic accommodation and the sealing element may define a flange extending circumferentially about the outer surface and about the edge of the terminal holder.

The flange may fit tightly against the edge and thereby maintain the sealing element in a releasably attached position where it defines a closure for the cavity. In one embodiment, the flange is not in contact with the edge but extends about the edge at a distance from the edge. In this embodiment, the engagement between the sockets and the terminal pins ensures the position of the sealing element.

The connector may comprise a cable seal connector attached to the cable housing e.g. by a snap fitting structure. The cable seal connector may form aforementioned cable seals and it may allow a procedure where the cable assembly is pre-fitted to the cable seals and subsequently joined to the cable housing.

The sealing element and/or the cable seal connector may be electrically non-conductive. They may e.g., be made of plastic.

The sealing element may comprise an annular wall extending upwards from the outer surface and entering the cavity, and it may additionally or alternatively comprise at least one annular ridge extending upwards from the outer surface and extending about the cavity, outside the cavity. The at least one annular ridge may extend e.g., parallel with the annular wall.

The cable space may be constituted at least partly by a plurality of separate cable conduits extending in the sealing element, and the individual cable conduits may form individual openings in the sealing element. This limits potential contamination and prevents spreading to all sockets should one single cable conduit become contaminated.

The individual cable conduits may form individual openings in the cable housing, and the cable housing may form a geometric locking with the cable seal connector, e.g., in the form of a ridge or groove extending about the cable conduits, the ridge or groove cooperating with a groove or ridge on the cable seal connector. In that way, the cable seal connector may be snap-locked onto the cable housing.

Each socket may be locked to the sealing element to prevent movement of the sockets relative to the openings in which the pins are received. In one embodiment, the sockets form a geometric locking with an inner surface of a corresponding one of the cable conduits, e.g., in the form of a ridge or projection, or a depression or groove cooperating with a matching ridge or projection, or a depression or groove on an inner surface of the cable conduit. This facilitates easy assembly and complete locking of the sockets to the sealing element and thereby facilitates use of the sockets for maintaining the position of the outer surface of the sealing element as a closure for the cavity.

In a fourth aspect, the disclosure provides a method of assembling the compressor according to the first aspect. The method comprises:

a) providing the sealing element and the cable housing, the cable housing being provided with a cable conduits and snap-lock features, b) providing a cable seal connector with cable seals, c) providing a cable assembly by affixing sockets to cables which are pre-cut in a specific length matching a distance from a terminal holder to an electric motor of the compressor, d) pulling the cables of the cable assembly through the cable seals of the cable seal connector, e) pushing the sockets into the cable conduits until the snap-lock feature in the cable housing snap-locks the sockets, f) attaching the cable seal connector by snap-fitting it onto the cable housing, g) attaching the connector to the terminal holder by inserting the conductive terminal pins into the holes in the sealing element until they engage the socket in the cable conduits of the cable housing, and h) hermetically closing the compressor housing by welding an upper part to a lower part of the housing.

Features mentioned relative to the first aspect of the disclosure may be applied also to the other aspects of the disclosure.

LIST OF DRAWINGS

The disclosure will now be described in further detail with reference to the accompanying drawings in which.

DETAILED DESCRIPTION OF THE DRAWINGS

Figure 1:
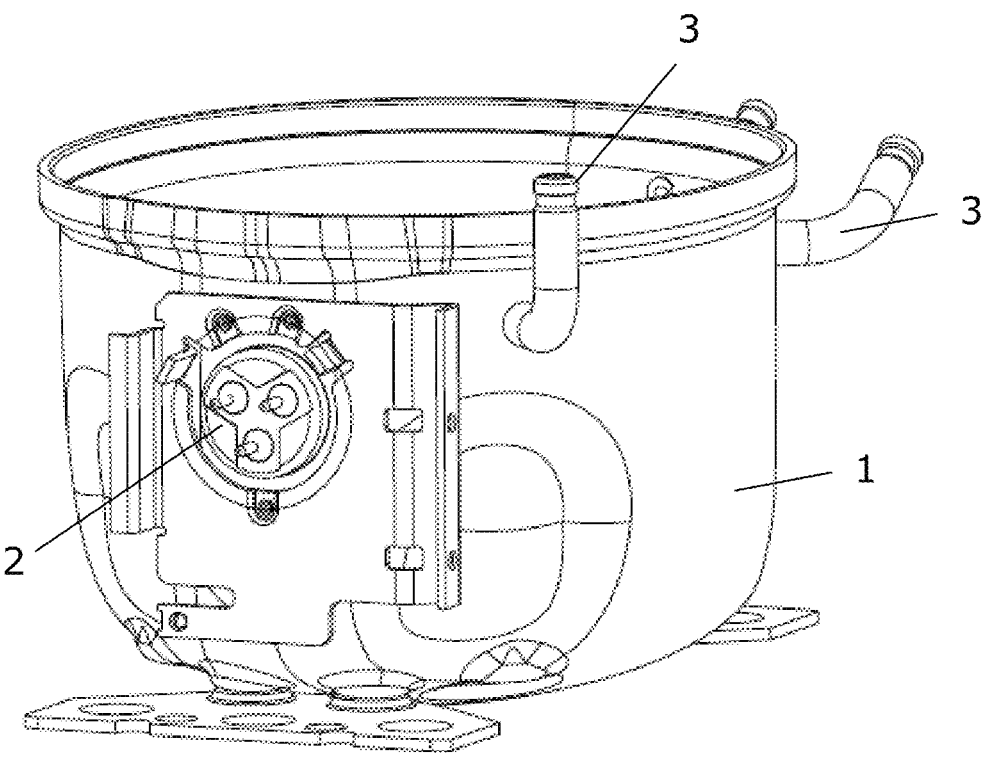
FIG. 1 illustrates a perspective view of a lower half part of a compressor housing with a hermetic terminal.

The following description refers to an embodiment of the disclosure. FIG. 1 illustrates a half part of a compressor housing comprising a lower part 1 and an upper part (not shown).

A hermetic terminal 2 is inserted in the housing wall, and when the upper part (not shown) is attached and welded to the lower part 1, the housing forms a sealed housing which contains a refrigerant which can be communicated e.g., between a condenser and an evaporator of a cooling or heating system via the pipe connections 3. By phase shifts between liquid and vapour phases, thermal exchange can provide efficient heating and cooling. The compressor houses a compression assembly, e.g., a piston compressor, and an electric motor, e.g., an AC motor, which drives the compression assembly. The complete housing and the compression assembly contained therein are not illustrated but these elements could be parts of hermetic compressors known in the art.

Figure 2:
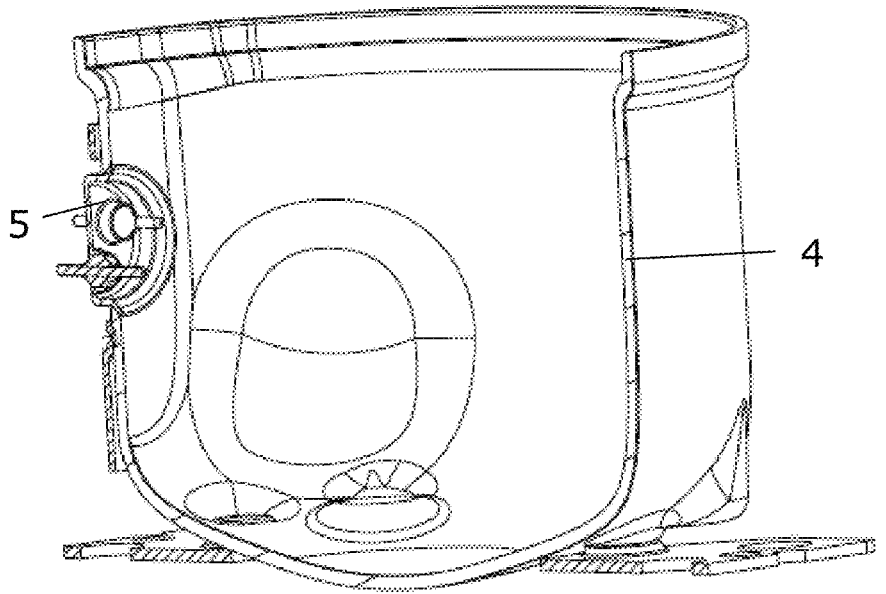
FIG. 2 illustrates a cross section of the housing wall and the hermetic terminal.

FIG. 2 illustrates a cross section of the housing wall 4 including the hermetic terminal 2. The illustration shows that the terminal holder 5 is welded into the housing wall 4 and thereby forms part of the housing wall.

Figure 3:
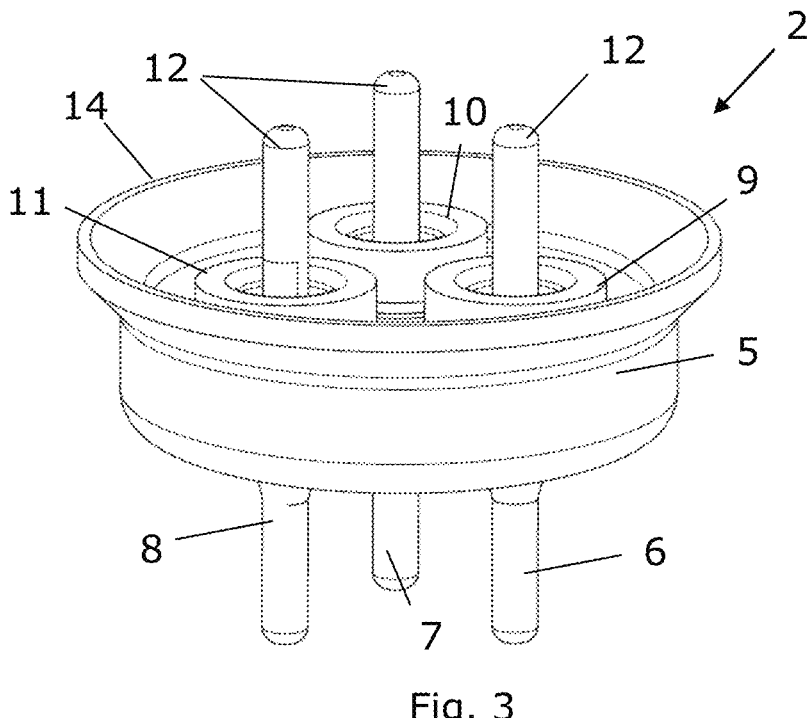
FIGS. 3 and 4 illustrate a traditional hermetic terminal.

FIG. 3 illustrates a perspective view of a hermetic terminal including a terminal holder 5 made of steel and configured to be welded into the housing wall of the compressor. The hermetic terminal further comprises three pins 6, 7, 8, and three insulative sealing elements 9, 10, 11 forming an insulative structure. The terminal pins form tip ends 12 inside the compressor housing. These tip ends are configured for connection to the main and auxiliary windings of the electric motor via a connector which is explained further with reference to FIGS. 6-13.

In all illustrations, the hermetic terminal comprises three terminal pins. This corresponds to a zero pin and one phase for each winding of a motor with a main winding and an auxiliary winding. However, other numbers of terminal pins and other ways of connecting the terminal pins to the motor may be considered within this disclosure, e.g., two terminal pins for connecting phase and zero to a motor requiring only one phase connector, e.g., a motor having only one winding.

Figure 4:
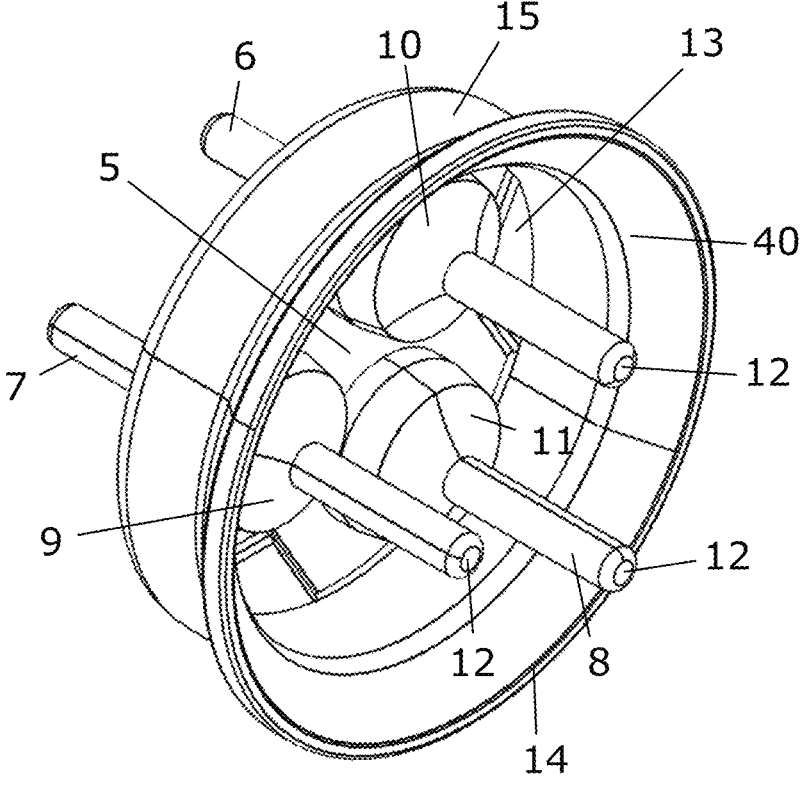

FIG. 4 illustrates the hermetic terminal in a view where the cavity 40 defined by the terminal holder is more clearly seen. The inner surface 13 of the terminal holder 5 is electrically separated from the terminal pins 6, 7, 8 by the insulative sealing elements 9, 10, 11. The insulative sealing elements are typically made of glass or similar nonconductive material. During use, liquids in the housing contaminates the inner surface 13 and due to metal fragments from tear and wear, a leak current may be generated from the terminal pins to the terminal holder, and via the terminal holder, to the entire compressor housing.

The cavity formed by the terminal holder is terminated upwardly by the circumferential edge 14 of the sidewall 15. The sidewall is welded into the compressor housing and thereby forms one single unit with the compressor housing.

Figures 5, 6, 7:
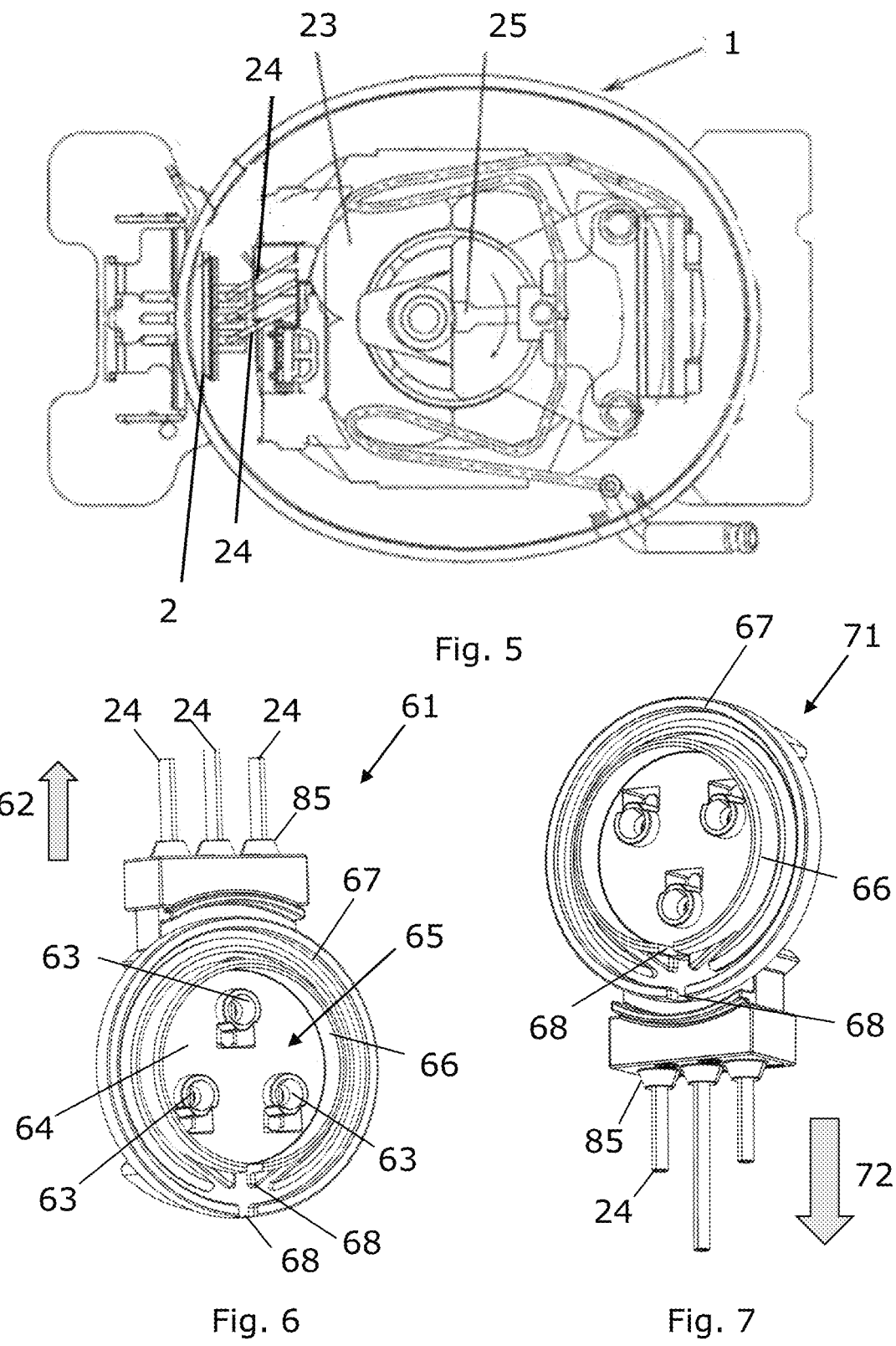
FIG. 5 illustrates a compressor housing seen from above and illustrating schematically the compression assembly and connections between the hermetic terminal and the electric motor, illustrates a sealing element.
FIGS. 6 and 7 illustrate the connector in two different embodiments with the cables extending upwards and downwards, respectively.

FIG. 5 illustrates a compressor housing seen from above and illustrating schematically the compression assembly 23 and cables 24 connecting the terminal pins with the electric motor 25 of the compression assembly. These cables extend inside the hermetic encapsulation.

FIGS. 6 and 7 illustrate two embodiments of the connector 61, 71. In FIG. 6, the connector 61 is configured for cables 24 extending vertically upwards as illustrated by the arrow 62 and in in FIG. 7, the connector 71 is configured for cables extending vertically downwards as illustrated by the arrow 72.

Figure 8:
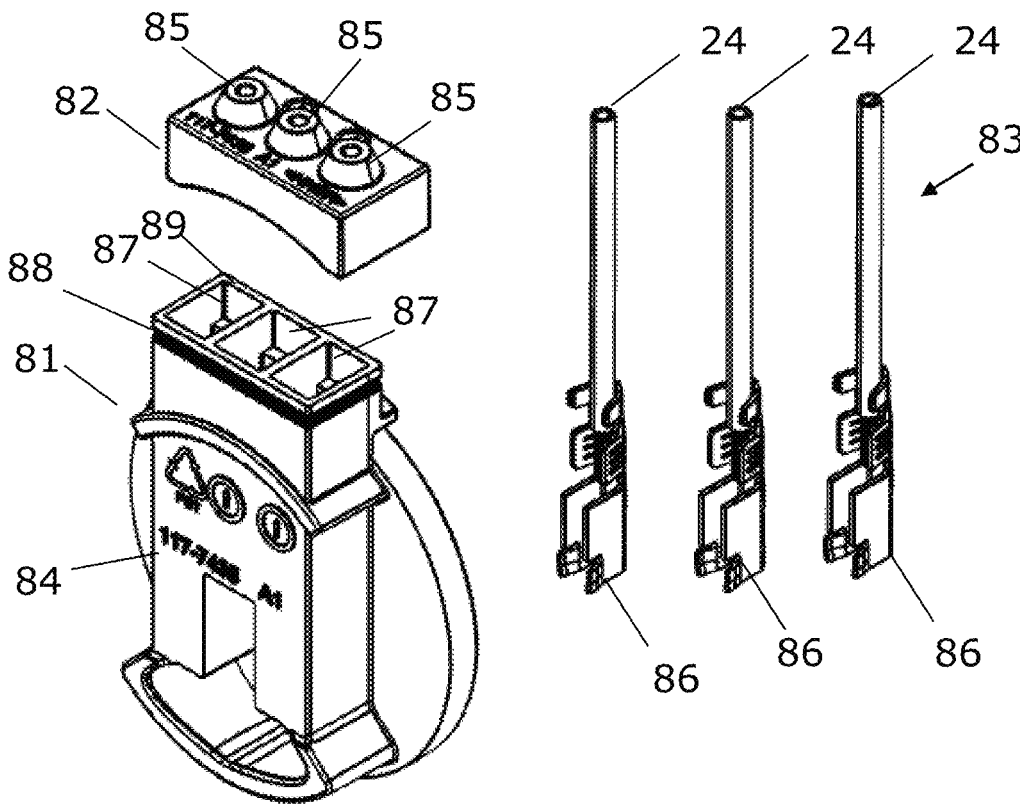
FIGS. 8-10 illustrate internal components of the connector including the cable assembly with the sockets.
Figures 9, 10:
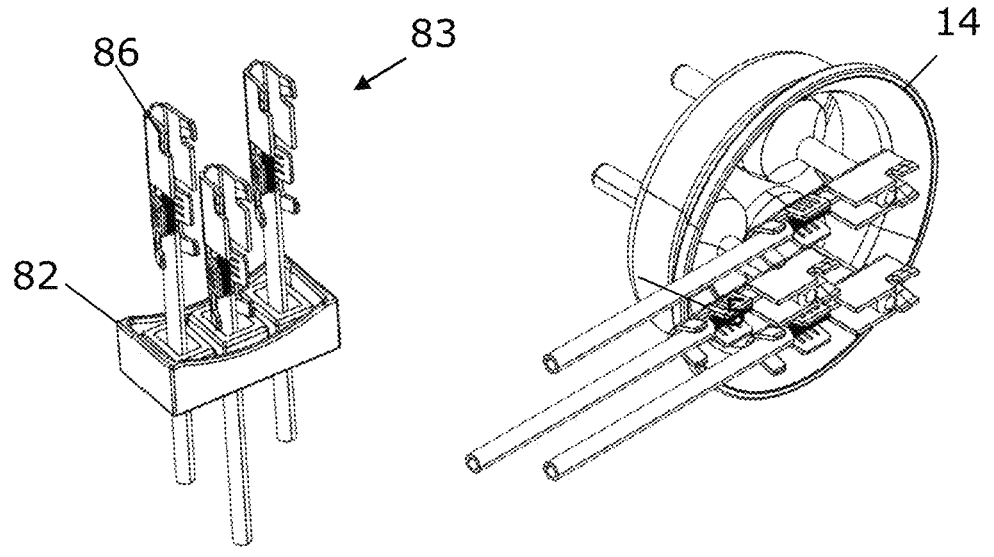

The connector is arranged inside the hermetic accommodation and comprises a socket for each terminal pin. The sockets 86 are shown in FIGS. 8, 9 and 10 and they are arranged behind the openings 63 formed in the outer surface 64 of a sealing element 65.

Each socket receives a corresponding one of the terminal pins which is inserted through a corresponding one of the openings 63.

The sealing element 65 and the cable housing 84 may particularly be formed in one part, herein referred to as connector body 81. As illustrated in FIG. 8, the connector thereby comprises three main components referred herein as a connector body 81, a seal connector 82, and a cable assembly 83. The connector body forms the cable housing 84 accommodating each socket in a cable space outside the cavity, and it forms the sealing element.

The cable assembly comprises several cables 24 and a corresponding socket 86.

The connector body 81 is arranged such that the outer surface 64 (c.f. FIG. 6) of the sealing element is towards the cavity formed by the terminal holder 5.

The sealing element forms a closure for the cavity and thereby separates the cavity from the compression assembly in the hermetic accommodation.

Each cable 24 extends from one of the sockets and connects to the motor. The sockets are arranged in the cable space, and the cables extend through the cable space and exits via the cable seal connector 82 forming part of the cable housing 84 and being attached to the connector body as a separate component. The cable seal connector 82 defines an exit for the cables out of the cable space.

The cable seal connector 82 comprises cable seals 85 fitting tightly between the cable and the cable connector 82 and formed either as one single element fitting around all cables or formed as several individual fitting elements fitting a corresponding one of the cables.

The cable housing forms a sealed accommodation of the sockets separated from the compression assembly in the hermetic accommodation. It therefore limits the risk of contaminants reaching the sealing elements 9, 10, 11.

The outer surface 64 of the connector body 81 is shaped and sized to seal against the edge 14 to thereby define the enclosed space in the cavity. The enclosed space encloses the surface of the insulative structure which is exposed in the cavity.

In addition to the sealing against ingress of liquids into the enclosed space, the connector connects the motor electrically to the terminal pins via sockets, and it seals the sockets against contamination. This further improves the compressor and reduces the risk of contaminants reaching the sealing elements 9, 10, 11 where it may create a craping current leakage.

The outer surface 64 of the connector body 81 is radially larger than the edge 14 of the terminal holder, and it therefore coextends the edge. It includes an annular wall 66 extending upwards from the outer surface and configured to enter the cavity. The annular wall and the terminal holder have matching sizes and shapes such that the annular wall fits tightly into the cavity, e.g., such that the annular wall 66 is in contact with the sidewall 15. In this way, the annular wall supports the fixation of the sealing element onto the hermetic terminal and supports the function of preventing ingress of liquids into the cavity.

In the disclosed embodiment, the sealing element further comprises a plurality of annular ridges 67 extending upwards from the base. The ridges are lower than the annular wall 66 but they extend in parallel with the annular wall, circumferentially around the annular wall. In the disclosed embodiment, both the ridges and the wall are circular. The annular ridges extend outside the cavity when the sealing element is attached to the terminal holder.

The annular wall 66 may define a flange extending circumferentially within the edge of the terminal holder and it may be in close contact with the edge to seal the cavity.

An inner one of the annular ridges may define a flange extending circumferentially about the outer surface of the edge of the terminal holder and it may be in close contact with the edge to seal the cavity.

Both the annular wall and the annular ridges comprise indentations 68. These indentations provide a discontinuity of the wall and ridges and thereby define openings across the wall or and ridges. This allows oil and refrigerant to drain away from the connector and further reduces the risk of contamination entering the cavity.

The electric compressor may define an operational orientation. This orientation is typically dictated by gravity acting on liquids in the housing and ensures that lubrication oil reaches the oil pump etc. FIG. 6 illustrates an orientation wherein the cable direction, illustrated by the arrow, is upwards relative to gravity when the electric compressor is in the operational orientation. The indentations are also located in a lower portion of the annular ridge or annular wall relative to gravity when the electric compressor is in the operational orientation, and liquids which may have entered the cavity can thereby drain downwards by gravity. The indentations are symmetrically placed relative to a vertical plane when the electric compressor is in the operational orientation.

FIG. 7 illustrates an orientation wherein the cable direction, illustrated by the arrow, is downwards relative to gravity when the electric compressor is in the operational orientation. The indentations are also located in a lower portion of the annular ridge or annular wall relative to gravity when the electric compressor is in the operational orientation, i.e., they are located at that end where the cables exit the connector. Liquids which may have entered the cavity can thereby drain downwards by gravity. The indentations are symmetrically placed relative to a vertical plane when the electric compressor is in the operational orientation.

FIGS. 8, 9, and 10 illustrate details of the cable assembly and sockets 86. The sockets are made by metal spring means forming a firm grip against the surface of the terminal pins. This is illustrated in FIG. 10. The sockets are fixed to the connector body 81 and they therefore function as a retaining means for retaining the position of the connector body 81 against the edge 14 of the terminal holder 5.

Figure 13:
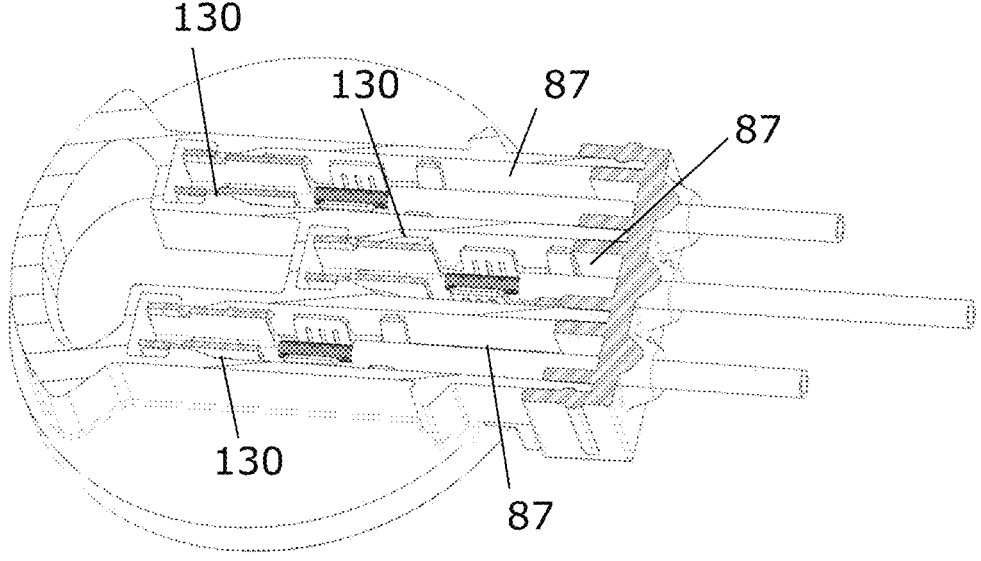
FIG. 13 illustrates details of the cable housing 84 including the cable conduits 87.

The cable space is constituted partly by the three cable conduits 87 shown also in FIG. 13.

The resilient spring means is of a kind generally known e.g., from sockets, e.g., from power sockets and further includes a mechanical feature cooperating with a corresponding feature in the bottom of the cable conduits 87 to fixate the spring in the cable conduit, e.g., a projection engaging with a depression in the cable conduits.

FIG. 9 illustrates the cable assembly 83 being pre-fitted in the cable seal connector 82. In an assembly procedure, this pre-fitted component is attached to the connector body 81 by inserting the three sockets into a corresponding cable conduit 87 until the cable seal connector 82 snap-fits the connector body, and particularly the ridge 88 formed around the opening into the three cable conduits 87 in the body of the connector body 81.

FIG. 9 illustrates the cable seal connector 82 when disconnected from the connector body 81 and without the hermetic terminal.

FIG. 10 illustrates the hermetic terminal and the cable assembly 83 in a perspective view and, for illustrative purpose, without the cable seal connector 82 and without the connector body 81. This reveals the internal components and particularly the sockets 86 when catching the pins inserted through the holes in the not-illustrated outer surface of the sealing element.

Figure 11:
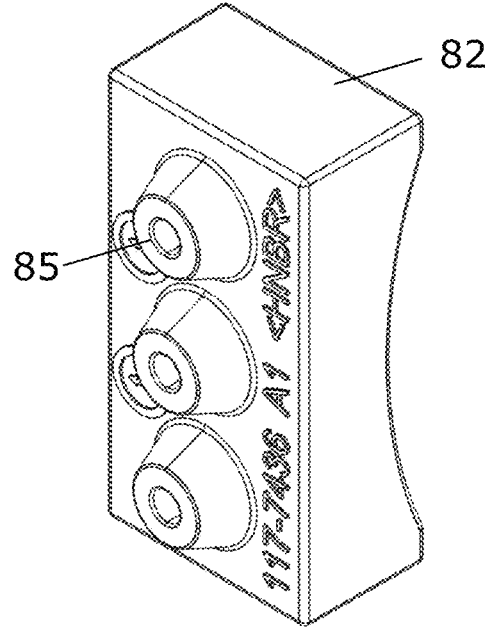
FIGS. 11-12 illustrate details of the cable seal connector.

The cable seal connector 82 is illustrated separately in FIG. 11. In this view, it is clearly shown that the cable seals 85 may be separate and more elastically deformable elements pressed into or moulded into the harder and less elastically deformable body of the cable seal connector 82. The cable seal connector and the cable seals could be made in a 2K injection moulding process.

Figure 12:
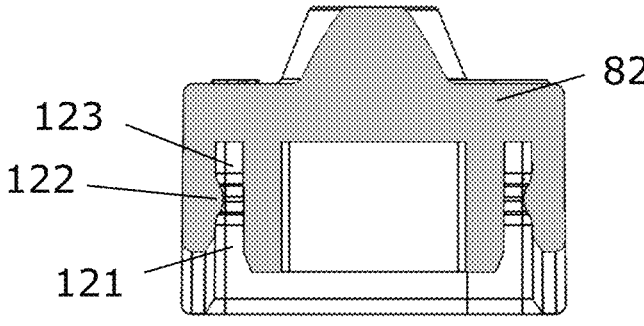

FIG. 12 illustrates a cross section of the cable seal connector 82. The cable seal connector comprises a recessed groove 121 configured to receive the edge 89 and thereby the ridge 88 of the connector body 81 and thereby provides a sealed connection. The groove 121 forms a projection 122 mechanically engaging and locking edge with the ridge 88 in the cavity 123 above the projection 122.

FIG. 13 illustrates the cable housing 84 in an open state with a rear surface removed. This reveals the cable conduits 87 and a specific snap-lock feature 130 at the bottom of each cable conduit. The snap-lock feature snaps the sockets 86 into a fixed position when the sockets and cables are inserted through the cable conduits. This allows an easy assembly procedure.

Particularly, the assembly procedure may include the following steps:

a) the connector body 81 is moulded in one piece including the sealing element 65 with the openings 63 and including the cable housing 84. This one-piece element could be made in an injection moulding process by using cores for defining the cable conduits 87.

b) the cable seal connector 82 is made in one component, e.g. in a 2K injection moulding process using a more elastically deformable material for the cable seals 85.

c) the cable assembly 83 is prepared by affixing sockets 86 to cables which are pre-cut in a specific length matching the distance from the terminal holder to the electric motor driving the electrically driven compression assembly.

d) the cables of the cable assembly are drawn through the cable seals.

e) the sockets 86 are pushed into the cable conduits until the snap-lock feature 130 in the cable housing snap-locks the sockets and keeps a fixed position of the sockets relative to the openings 63.

f) the cable seal connector 82 is snap-fitted onto the connector body 81.

g) the connector is attached to the terminal holder by inserting the conductive terminal pins 6,7,8 into the holes 63 until they engage the socket 86 in the cable conduits.

h) the compressor housing is hermetically closed by welding the upper part (not shown) to the lower part 1.

In this state, oil, refrigerant, and contaminants may be spread inside the housing during operation, and the connector prevents migration thereof to the conductive pins and therefore prevents a current between the pins 6,7,8 and the housing wall 4.

The invention claimed is:

1. An electric compressor comprising:

a compressor housing with a wall forming a hermetic accommodation, an electrically driven compression assembly arranged in the hermetic accommodation, a terminal holder forming part of the wall and defining a cavity in the hermetic accommodation, conductive terminal pins extending through the terminal holder and terminating in the hermetic accommodation, the terminal pins being electrically insulated from the terminal holder, and a connector arranged in the hermetic accommodation and comprising:

a socket for each terminal pin, each socket receiving a corresponding one of the terminal pins, a cable housing accommodating each socket in a cable space outside the cavity, a sealing element with an outer surface facing the cavity and an opposite inner surface, the sealing element defining a closure for the cavity and thereby separating the cavity from the compression assembly in the hermetic accommodation, and a cable for each socket extending from a corresponding one of the sockets out of the cable space and connecting one of the terminal pins electrically to the compression assembly, wherein the cable housing forms a sealed accommodation of the sockets separated from the compression assembly in the hermetic accommodation.

2. The compressor according to claim 1, wherein the cable housing is directly against the sealing element.

3. The compressor according to claim 2, wherein the sealing element and cable housing are non-releasably joined or formed in one part.

4. The compressor according to claim 1, wherein the connector comprises at least one cable seal forming part of or being attached to the cable housing and defining an exit for the cables out of the cable space, the cable seal fitting tightly between the cable and the cable housing.

5. The compressor according to claim 4, wherein the cable seal is more elastically deformable than the cable housing.

6. The compressor according to claim 1, wherein the outer surface comprises an opening for each terminal pin, each opening receiving a corresponding one of the terminal pins into the cable space of the cable housing.

7. The compressor according to claim 6, wherein each opening fits tightly about the corresponding terminal pin and the sealing element thereby seals the cable space from the cavity.

8. The compressor according to claim 1, wherein each socket comprises an elastically deformable metal member arranged directly adjacent the inner surface of the sealing element and configured to receive the terminal pins.

9. The compressor according to claim 8, wherein the elastically deformable metal member is fixed to the sealing element and thereby maintains the sealing element in a releasably attached position where it defines a closure for the cavity when a terminal pin is fixated to the socket by friction.

10. The compressor according to claim 1, wherein the terminal holder defines an edge extending about the cavity inside the hermetic accommodation and the sealing element defines a flange extending circumferentially about the edge of the terminal holder or extending circumferentially within the edge of the terminal holder.

11. The compressor according to claim 10, wherein the flange fits tightly against the edge and thereby maintains the sealing element in a releasably attached position where it defines a closure for the cavity.

12. The compressor according to claim 1, comprising a cable seal connector attached to the cable housing.

13. The compressor according to claim 12, wherein the cable housing forms a geometric locking with the cable seal connector.

14. The compressor according to claim 1, wherein the cable space is constituted at least partly by a plurality of separate cable conduits extending in the cable housing.

15. The compressor according to claim 14, wherein the individual cable conduits form individual openings into the cable housing.

16. The compressor according to claim 1, wherein each socket forms a geometric locking with the cable housing.

17. A method of assembling the compressor according to claim 1, the method comprising:

a) providing the sealing element and the cable housing, the cable housing being provided with a cable conduits and snap-lock features, b) providing a cable seal connector with cable seals, c) providing a cable assembly by affixing sockets to cables which are pre-cut in a specific length matching a distance from a terminal holder to an electric motor of the compressor, d) pulling the cables of the cable assembly through the cable seals of the cable seal connector, e) pushing the sockets into the cable conduits until the snap-lock feature in the cable housing snap-locks the sockets, f) attaching the cable seal connector by snap-fitting it onto the cable housing, g) attaching the connector to the terminal holder by inserting the conductive terminal pins into the holes in the sealing element until they engage the socket in the cable conduits of the cable housing, and h) hermetically closing the compressor housing by welding an upper part to a lower part of the housing.

* * * * *